COMPONENT RETAINING DEVICE

Filed April 26, 1961 2 Sheets-Sheet 1

INVENTOR.
GEORGE H. ELLIOTT
BY R. E. Geangue
ATTORNEY

COMPONENT RETAINING DEVICE

Filed April 26, 1961 2 Sheets-Sheet 2

*INVENTOR.*
GEORGE H. ELLIOTT

*BY* R. E. Grangue

ATTORNEY

3,207,954
COMPONENT RETAINING DEVICE

George H. Elliott, Van Nuys, Calif., assignor to Atohm Electronics, Sun Valley, Calif., a corporation of California Filed Apr. 26, 1961, Ser. No. 105,630
8 Claims. (Cl. 317—99)

This invention relates to a component retaining device and more particularly to a device for retaining a housing, having a component such as a potentiometer, or other electrical element housed therein, in juxtaposition to a board such as a dielectric sheet, having a wiring pattern printed thereon or the like.

In the past, fasteners have been extensively used to secure the housing to the board which necessitate holes extending through the housing through which the fasteners, like screws, rivets, or the like, extend. Such fasteners require housings of increased size so as to accommodate the fasteners without interfering with the element within the housing. The means of this invention, on the other hand, enables the use of a more compact housing of minimum size to house electrical or other elements, thereby affording a greater package density and saving space on the board. Furthermore, the retaining means of this invention requires holes extending through the board which is the same size as the clamping means thereof and which if not already located on the board may be easily drilled therethrough without the necessity for providing holes of sufficient size to accommodate tolerance buildup.

In the past, when fasteners were used which extended through holes of the housing, such holes were frequently mismatched to holes on the board when the housing was juxtaposed thereto. Furthermore, when more than one of the housings were stacked together on the board, the pre-drilled holes of the housing frequently could not be aligned for insertion of a screw or other fastener through the aligned holes because of build-up of manufacturing tolerances. Such mismatching of holes frequently resulted in the necessity for post drilling of the housings to enlarge the holes sufficiently to align properly for reception of the fasteners.

This invention further provides for means for assembling of the retaining means thereof which requires a minimum of space and provides a neater, less obstructive exterior to the finished product.

Furthermore, this invention provides a new and improved component retaining device which has a high natural frequency and is thus not subject to vibration problems as would be a screw and nut combination having a low natural frequency.

It is therefore an object of this invention to provide a new and improved component retaining device in which a component is fixed in relationship to a board.

Another object of this invention is to provide a new and improved component retaining device in which the component is easily and readily fixed to the board by means adaptable to present means of electrical assembly, such as soldering or end clipping.

A further object of this invention is to provide a new and improved component retaining device by which the component may be permanently or non-permanently fixed to the board.

Yet another object of this invention is to provide a new and improved component retaining device in which a clamping device thereof may be prefabricated or optionally formed during the assembly thereof.

Still a further object of this invention is to provide a new and improved component retaining device in which a plurality of components may be secured to the board in aligned stacked relationship.

Another object of this invention is to provide a new and improved component retaining device in which the component is selectively indexed relative to the board to which it is fixed and, in stacked relationship, one component is indexed relative to its adjacent component.

Another object of this invention is to provide a new and improved component retaining device which is economical to manufacture and capable of mass production.

A general object of this invention is to provide a new and improved component retaining device of the character described which overcomes disadvantages of prior means and methods heretofore intended to accomplish generally similar purposes.

These and other objects of this invention will be more apparent from the following detailed description, drawings and appended claims.

Figure 1:
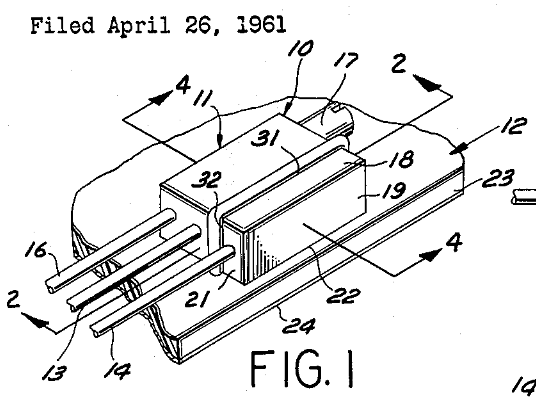
FIGURE 1 is a perspective view, in elevation, illustrating a first embodiment of this invention.
Figure 2:
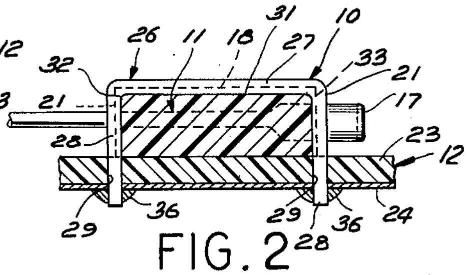
FIGURE 2 is a vertical, cross-sectional view as taken substantially along the line 2—2 of FIGURE 1.
Figure 3:
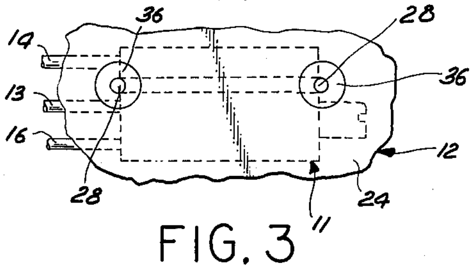
FIGURE 3 is a fragmentary, bottom view thereof, in elevation.
Figure 4:
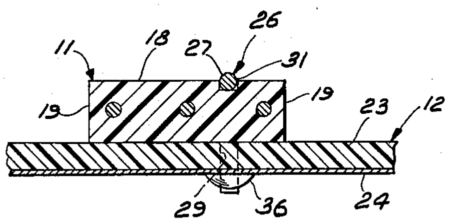
FIGURE 4 is a vertical, cross-sectional view taken substantially along the line 4—4 of FIGURE 1.

Referring in detail to the drawings, there is shown by way of illustration, but not of limitation, a first embodiment of this invention designed and constructed in accordance with this invention and generally designated by the numeral 10. In the first embodiment of FIGURES 1–4, inclusive, a housing, hereinafter referred to as a component, having a predetermined outer configuration, herein illustrated as being rectangular and generally designated by the number 11, is juxtaposed to a board or sheet 12 for securement thereto.

The component 11 is illustrated herein as being in solid form; it is to be understood, however, that any suitable cavities may be provided therein so as to adapt to the housing to house an electrical or other element, such as a potentiometer, transistor, relay and the like. Optionally, the housing 11 may be cast, pressed, or otherwise fixed, around the element therein. As an example, the housing 11 may have conductors extending therefrom, like conductors 13 and 14 leading in and out of the housing and connected to a potentiometer coil (not shown) therein, an additional conductor 16, secured to a wiper thereof (not shown), and an enlarged head 17 of an adjustment means (not shown) extending to the element or the wiper within the housing.

The housing 11 includes lateral surfaces formed by its top 18, sides 19, and a bottom 22.

The board 12 is herein illustrated as being laminated and including a dielectric layer, indicated by the numeral 23, having a metallic coating 24 secured to the underside thereof.

A clamping means is provided for securing the component or housing 11 to the board 12 in juxtaposition thereto. The clamping means, designated by the numeral 26, is U-shaped in configuration, including a bight portion 27 and a pair of spaced, substantially parallel, free ends 28. The free ends 28 are preferably of sufficient length to encompass three sides of the housing 11 and extend through apertures 29 extending through the board 12.

A groove 31 is formed extending across the exterior of the top surface 18 of the housing 11 in which the bight portion 27 of the clamp 26 resides. Grooves 32 and 33, complementary to the groove 31 of the upper surface 18, are preferably but not necessarily formed in the sides 21 in coplanar relationship to the groove 31, in which the portion of the free ends 28 adjacent to the bight portion 27 reside, the grooves 32 and 33 being aligned with the aperture 29 whereby the free ends 28 are retained in the grooves 32 and 33. Grooves 31–33, inclusive, not only index the clamping means 26 relative to the housing 11 but serve to index or polarize the relationship of the housing 11 to the board 12 to facilitate positioning of the leads 13, 14 and 16 in the desired direction relative to the board 12.

The clamping means 26 is secured to the board 12 to prevent removal of the housing 11 therefrom in the following manner. A collar, or bead, indicated by the numeral 36, is formed by thermally applying a thermoplastic metallic material such as solder to end portions of the free ends 28 extending outwardly from the underside of the board 12. For this purpose, the clamping means 26 is preferably formed of a corrosive-resistant material, such as stainless steel, and is preferably plated by a metal, such as gold or the like, which is conducive to solderability. The collars 36 are preferably formed so as to additionally adhere to the metallic coating 24 underlying the board 12.

It will be more apparent from the foregoing description that the housing 11, having coplanar grooves 31, 32 and 33 formed in outer surfaces thereof and aligned with apertures 29 of the board 12, is secured to the board 12 in fixed relationship thereto by clamping means 26 having a bight portion 27 residing in the groove 31 and its free end 28 residing in the grooves 32 and 33, and extending through the apertures 29 and outwardly therefrom. The portion of the ends 28 extending outwardly of the underside of the board 12 are fixed to the underside by the collar or beads 36 of soldering material connecting the free ends to the underside and preventing withdrawal of the free ends.

The clamp 26 is preferably made of a wire of round or other configuration whereas the grooves 31–33 inclusive may be of half-round configuration or square, as illustrated. It is to be understood that the clamp 26 may be prefabricated in the U-shaped configuration or bent during assembly to conform to the configuration of the grooves of the surfaces 18 and 21. Furthermore, the free ends 28 may be of any desired length and trimmed after soldering, if desired, so as to accommodate housings 11 of various heights.

Figure 5:
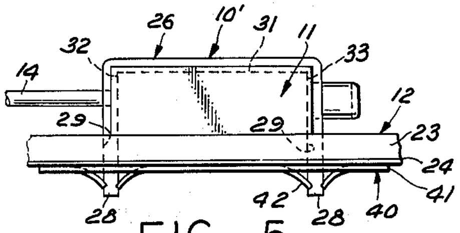
FIGURE 5 is a side view, in elevation, of a modified embodiment of this invention.
Figure 6:
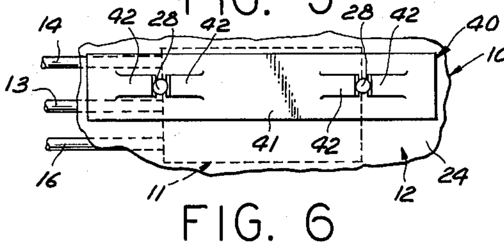
FIGURE 6 is a fragmentary bottom view thereof.

In the modification 10' of the FIGURES 5 and 6, the component 11 is illustrated as being removably retained on the board 12. In the instant embodiment, like parts are referred to by like numbers. As in the first embodiment, a clamping means 26 is arranged around three sides of the component 11 so as to reside in coplanar grooves 31, 32 and 33, thereof, and having its free ends 28 extending through holes like 29 and outwardly of the underside of the board 12. A clip means, generally designated by the numeral 40 and preferably made of a spring steel or other suitable material, is snapped over the free ends 28 to retain the clamp 26 against withdrawal from the aperture 29 of the board 12.

Figure 10:
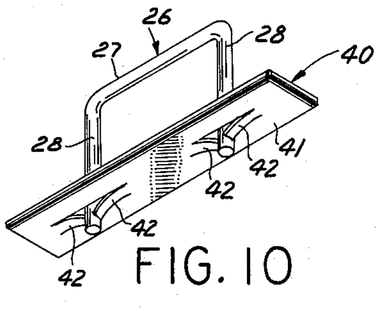
FIGURE 10 is a perspective view, in elevation, of clamping and clip means of the embodiment of FIGURES 5 and 6, illustrated in greater detail.

As best seen in the FIGURES 5 and 6 and in FIGURE 10, the clip 40 includes an elongated body 41 having pairs of tabs 42 struck outwardly and spaced so as to engage the free ends 28. The tabs 42 are resilient so as to be upset when the ends 28 are inserted therethrough but resist withdrawal of the ends.

Figure 7:
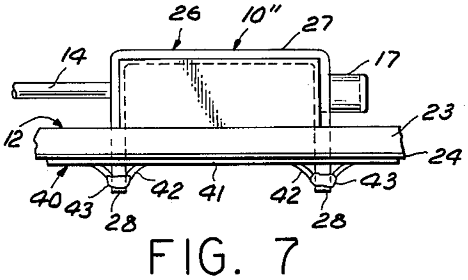
FIGURE 7 is a side view, in elevation, similar to FIGURE 5, illustrating a third embodiment of this invention.
Figure 8:
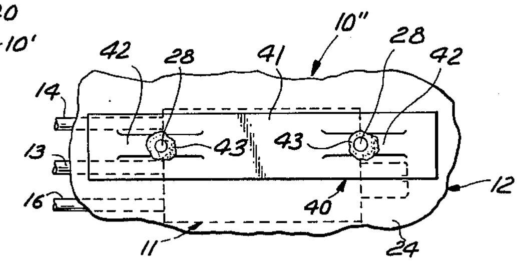
FIGURE 8 is a fragmentary bottom view thereof, in elevation.

As best seen in FIGURES 7 and 8, the clip 40 of the embodiment 10'' illustrated therein is preferably of a material conducive to solderability and may be permanently secured to the free ends 28 by the application of beads or collars normally applied to the ends 28 and to the tabs 42 so as to prevent removal of the ends 28 from the clip 40.

Figure 9:
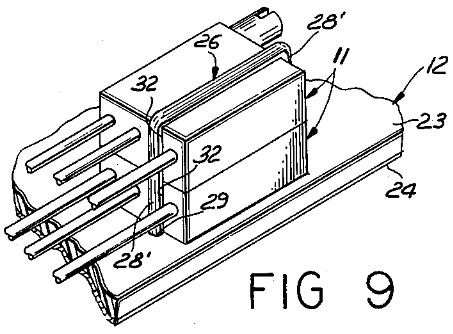
FIGURE 9 is a perspective view, in elevation, illustrating a plurality of components in stacked relationship and secured in a manner of the teaching of this invention.

As best seen in FIGURE 9, a plurality of components of equal size and configuration, like the component 11, may be easily and readily secured to the board 12 in stacked relationship. Clamping means 26, illustrated in the instant embodiment, is provided with free ends 28' of sufficient length so as to encompass the pair of components 11 and extend outwardly of the underside of the board 12. The components 11 are arranged in aligned relationship so as to align the grooves 32 and 33 of one component with the grooves 32 and 33 of its adjacent component, thereby indexing one component to the other and indexing the pair of components to the board 12 with the grooves 32 and 33 aligned with the apertures 29 of the board.

Figure 11:
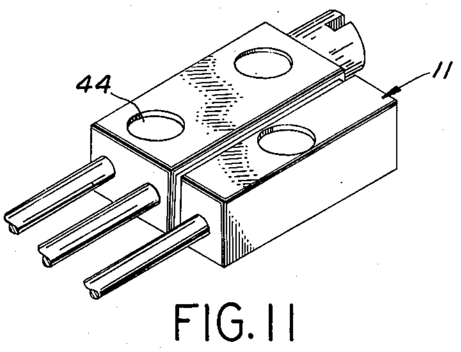
FIGURE 11 is a perspective view, in elevation, of an embodiment of this invention modified to include an indexing means.
Figure 12:
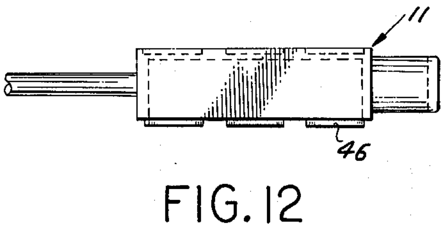
FIGURE 12 is a side view, in elevation, thereof.
Figure 13:
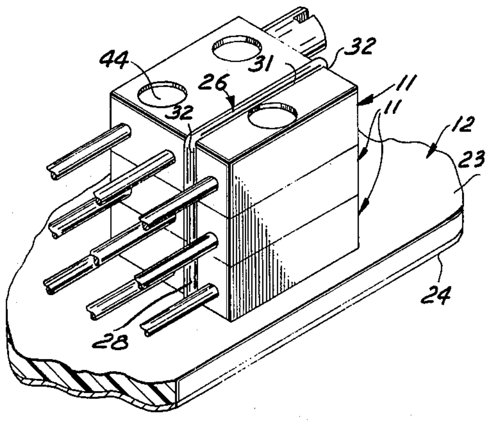
FIGURE 13 is a perspective view, in elevation, illustrating a plurality of components in stacked and indexed relationship.

FIGURES 11–13, inclusive, show a further means for indexing one component to an adjacent component by providing, as best seen in FIGURES 11 and 12, recesses 44 formed on one side of the component housing and complementary projections 46 extending from the opposite side thereof, so that when stacked, as illustrated in FIGURE 13, the housings 11 are indexed by inserting the projections 46 of one housing 11 into the complementary recesses 44 of its adjacent component 11. The indexing means 44–46, assures indexing between components and prevents transverse movement therebetween, in addition to the indexing of the free ends 28 in aligned grooves 32 and 33. The indexing means 44–46 further facilitates accurate aligning of the grooves 32 and 33 of adjacent components.

Furthermore, as illustrated in FIGURE 13, a plurality of components exceeding a pair, may be secured to the board 12 by providing free ends 28 of sufficient length so as to extend through the board 12 and reach beyond the underside of the board.

Figure 14:
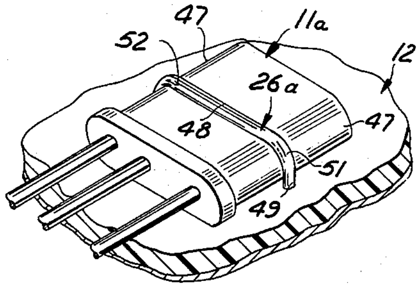
FIGURES 14 and 15 are perspective views, in elevation, illustrating the invention modified so as to accommodate various configurations of components exemplified therein.
Figure 15:
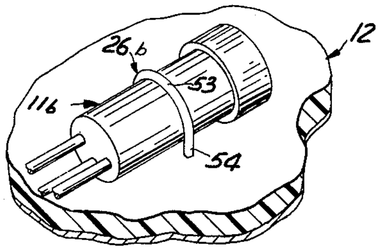

As best seen in FIGURES 14 and 15, the clamping means 26 may be suitably modified so as to clamp a component of any desired configuration to a board like 12. For example, a relatively flat component **11*a* of FIGURE 14, having rounded ends 47, is provided with a clamping means 26*a* having a rectilinear bight portion 48 and spaced parallel free ends 49 connected thereto by rounded corners 51 so as to snugly reside within a groove 52 formed on the exterior of the component 11*a*. The free ends 49, similarly to the free ends 28, are preferably provided with sufficient length to extend to the board 12** and outwardly of the underside thereof.

In FIGURE 15, a component having a cylindrical outer configuration, as referred to by the numeral **11*b*, is illustrated as being clamped to the board 12 by a clamping means 26 having a half-round bight portion 53 and rectilinear, spaced, parallel free ends 54 extending to the board 12 for securement to the underside thereof in the manner previously described, i.e., by soldering 36, by clip 40**, or by the combination of soldering and clips as illustrated in FIGURE 7.

The component retaining devices 10, 10' and 10'' of this invention have high natural frequency and are therefore not subject to vibration problems as would a screw and nut combination having a low natural frequency.

While the instant invention has been shown and described herein in what is conceived to be the most practical and preferred embodiments, it is recognized that departures may be made therefrom within the scope of the invention which is therefore not to be limited to the details disclosed herein but is to be afforded the full scope of the claims.

What is claimed as new and desired to secure by Letters Patent is:

1. A device for retaining a component on one side of a board of non-metallic material having a metallic coating on an opposite side thereof, comprising: means defining a groove extending substantially around the exterior of the component; means defining a pair of spaced apertures extending through the board; U-shaped clamping means having a bight portion and a pair of spaced parallel free ends, said clamping means being dimensioned so as to fit in said groove of said components and adapted to reside in said groove so as to encompass said components when juxtaposed to the board with said bight portion engaging the outermost side of the component and said free ends extending through said apertures of the board and outwardly of the underside thereof; and means for retaining the portion of said free ends extending outwardly of the opposite side of the board against withdrawal from said apertures of said board and said bight portion from said groove, said means including a thermo-plastic metallic material thermally secured to said free ends and said metallic coating of the board.

2. A retaining device comprising: a housing adapted to house an electrical component in electrically insulated relationship and having a predetermined outer geometrical configuration, said housing being juxtaposable to a board of dielectric material having a coating of metallic material on the underside thereof; means defining a groove on the exterior surface of said housing and extending substantially therearound; means defining a pair of spaced apertures extending through the board; U-shaped clamping means having a bight portion conforming to said geometrical configuration and a pair of spaced parallel free ends, said clamping means being dimensioned so as to fit in said groove of said housing and adapted to reside in said groove so as to encompass the housing when juxtaposed to the board, with said bight portion engaging the top of the housing and said free ends extending through said apertures of the board and outwardly of the underside thereof; and means for retaining the portion of said free ends extending outwardly of the underside of the board against withdrawal of said free ends of said clamping means from said apertures and said bight portion from said groove of said housing.

3. A device as defined in claim 2, wherein said last-mentioned means includes a thermo-plastic material thermally secured to said free ends and said metallic coating.

4. A device as defined in claim 2, wherein said last-mentioned means includes clip means removably and frictionally engaging said free ends so as to prevent withdrawal of said free ends of said clamping means from said apertures and said bight portion from said groove of said housing.

5. A device as defined in claim 2, wherein said groove extends around a predetermined portion of said housing.

6. A device for retaining an electrical component adjacent the surface of non-metallic material forming a circuit board and having a metallic coating on the opposite surface, comprising:

clamping means engaging at least a portion of the exterior surface of said component which is exposed after positioning said component adjacent said non-metallic surface, apertures in said printed circuit board at opposite sides of said component, said clamping means terminating in free ends extending transversely through said apertures and outwardly from said opposite surface of said board, and means located at said opposite surface for securing said free ends in non-conducting relationship with said opposite surface and holding said clamping means in tight engagement with said component in order to hold said component tightly against said non-metallic surface.

7. A device as defined in claim 6 having means on said exterior surface portion for retaining said clamping means in a predetermined position with respect to said component in order to properly align said component on said board.

8. A device for retaining a plurality of electrical components in a stack on the non-metallic side of a printed circuit board, comprising:

clamping means engaging at least a portion of the exterior surface of said components which is exposed after positioning one of said electrical components adjacent said non-metallic surface, apertures in said printed circuit board on opposite sides of said components' stack, said clamping means terminating in free ends extending transversely from said apertures and outwardly from said opposite surface of said board, and means located at said opposite surface for securing said free ends in non-conducting relationship with said opposite surface and holding said clamping means in tight engagement with said stack.

References Cited by the Examiner

UNITED STATES PATENTS

| | | | |
|---|---|---|---|
| 2,810,872 | 10/57 | Nord et al. | 174—50 |
| 2,935,653 | 5/60 | Campe et al. | 317—99 |
| 2,945,162 | 7/60 | Flour | 317—101 |
| 2,958,065 | 10/60 | Flanagan | 317—101 |
| 2,965,812 | 12/60 | Bedford | 317—101 |

JOHN F. BURNS, *Primary Examiner.*

SAMUEL BERNSTEIN, *Examiner.*